US012635545B2

(12) United States Patent
Ma et al.

(10) Patent No.: US 12,635,545 B2
(45) Date of Patent: May 19, 2026

(54) BALL MAP PATTERN

(71) Applicant: Cisco Technology, Inc., San Jose, CA (US)

(72) Inventors: Wenbin Ma, Shanghai (CN); Yuqing Zhu, Shanghai (CN); Weiying Ding, Shanghai (CN); Mingtong Zuo, Shanghai (CN); Mike Sapozhnikov, San Jose, CA (US); Srinath Penugonda, Milpitas, CA (US); David Nozadze, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 511 days.

(21) Appl. No.: 18/190,911

(22) Filed: Mar. 27, 2023

(65) Prior Publication Data

US 2024/0332154 A1 Oct. 3, 2024

(51) Int. Cl.
| | |
|---|---|
| *H01L 23/498* | (2006.01) |
| *H10W 70/65* | (2026.01) |
| *H10W 72/20* | (2026.01) |
| *H10W 90/00* | (2026.01) |

(52) U.S. Cl.
CPC .......... *H10W 70/65* (2026.01); *H10W 72/248* (2026.01); *H10W 72/252* (2026.01); *H10W 90/724* (2026.01)

(58) Field of Classification Search
CPC ... H01L 23/49838; H01L 24/13; H01L 24/14; H01L 24/16; H01L 2224/13111; H01L 2224/13139; H01L 2224/13147; H01L 2224/1413; H01L 2224/16227; H01L 23/49816; H01L 23/49822; H01L 23/50
See application file for complete search history.

(56) References Cited

U.S. PATENT DOCUMENTS

| | | | |
|---|---|---|---|
| 10,595,394 B1 * | 3/2020 | Kim ....................... | H05K 1/113 |
| 2010/0077363 A1 | 3/2010 | Catuogno | |
| 2010/0270681 A1 * | 10/2010 | Bird ....................... | H05K 1/113 |
| | | | 257/E23.068 |
| 2013/0134579 A1 | 5/2013 | Howard et al. | |
| 2013/0327565 A1 | 12/2013 | Qu | |
| 2020/0375024 A1 * | 11/2020 | Kim ..................... | H05K 3/4007 |
| 2021/0057319 A1 | 2/2021 | Rangaswamy et al. | |

* cited by examiner

*Primary Examiner* — Fernando L Toledo
*Assistant Examiner* — Shawn Shaw Muslim
(74) *Attorney, Agent, or Firm* — Patterson + Sheridan, LLP

(57) ABSTRACT

A printed circuit board includes a grid of pads and tracks. The grid of pads includes a first pair of adjacent signal pads arranged in a first column and a second pair of adjacent signal pads arranged in a first row. A first signal pad of the second pair is arranged in the first column. The grid of pads also includes a third pair of adjacent signal pads arranged in a second row. A second signal pad of the first pair is arranged in the second row. The grid of pads further includes a fourth pair of adjacent signal pads arranged in a second column. A third signal pad of the third pair is arranged in the second column. A fourth signal pad of the fourth pair is arranged in the first row. The tracks are electrically coupled to the first, second, third, and fourth pairs.

18 Claims, 5 Drawing Sheets

102

BALL MAP PATTERN

TECHNICAL FIELD

Embodiments presented in this disclosure generally relate to integrated circuits. More specifically, embodiments disclosed herein to a package ball map pattern for integrated circuits.

BACKGROUND

An integrated circuit may be electrically connected to a substrate (e.g., a printed circuit board) through solder balls arranged in a grid. Some of the solder balls may connect to ground while others may connect to tracks on the printed circuit board that carry signals to and from the integrated circuit.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
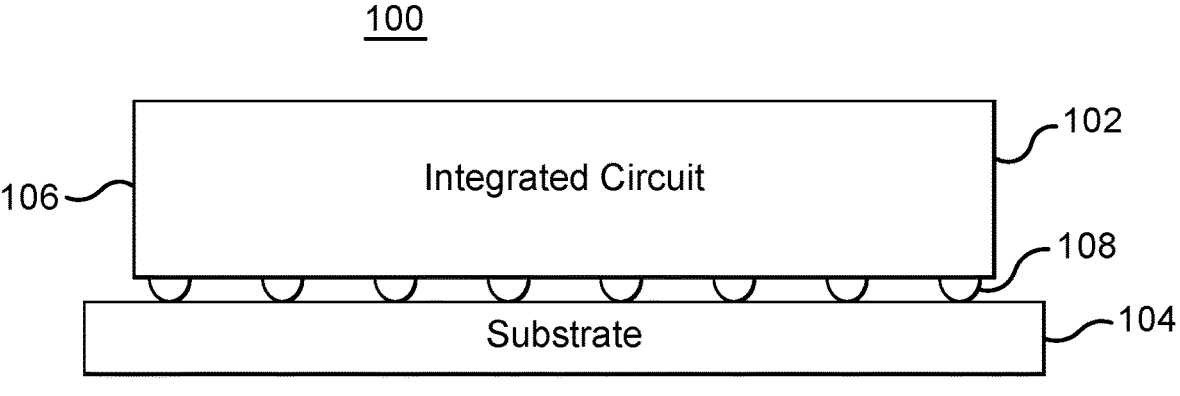
FIG. 1 illustrates an example system.

According to an embodiment, a substrate includes a grid of pads and a plurality of tracks. The grid of pads includes a first pair of adjacent signal pads arranged in a first column of the grid and a second pair of adjacent signal pads arranged in a first row of the grid. A first signal pad of the second pair is arranged in the first column. The grid of pads also includes a third pair of adjacent signal pads arranged in a second row of the grid. A second signal pad of the first pair is arranged in the second row. The grid of pads further includes a fourth pair of adjacent signal pads arranged in a second column of the grid. A third signal pad of the third pair is arranged in the second column. A fourth signal pad of the fourth pair is arranged in the first row. The first, second, third, and fourth pairs are distinct from each other. The plurality of tracks are electrically coupled to the first pair, the second pair, the third pair, and the fourth pair.

According to another embodiment, an integrated circuit package includes a ball grid array and a metal layer. The ball grid array includes a first pair of adjacent solder balls arranged in a first column and a second pair of adjacent solder balls arranged in a first row. A first solder ball of the second pair of adjacent signal solder balls is arranged in the first column. The ball grid array also includes a third pair of adjacent solder balls arranged in a second row. A second solder ball of the first pair of adjacent signal solder balls is arranged in the second row. The ball grid array further includes a fourth pair of adjacent solder balls arranged in a second column. A third solder ball of the third pair of adjacent signal solder balls is arranged in the second column. A fourth solder ball of the fourth pair of adjacent signal solder balls is arranged in the first row. The first pair of adjacent signal solder balls, the second pair of adjacent signal solder balls, the third pair of adjacent signal solder balls, and the fourth pair of adjacent signal solder balls are distinct from each other. The metal layer is electrically coupled to the first pair of adjacent signal solder balls, the second pair of adjacent signal solder balls, the third pair of adjacent signal solder balls, and the fourth pair of adjacent signal solder balls.

According to another embodiment, a system includes a printed circuit board and an integrated circuit package. The printed circuit board includes a first pair of signal pads arranged in a first column of a grid of pads and a second pair of signal pads arranged in a first row of the grid of pads. A first signal pad of the second pair is arranged in the first column. The printed circuit board also includes a third pair of signal pads arranged in a second row of the grid of pads. A second signal pad of the first pair is arranged in the second row. The printed circuit board further includes a fourth pair of signal pads arranged in a second column of the grid of pads. A third signal pad of the third pair is arranged in the second column. A fourth signal pad of the fourth pair is arranged in the first row. The first, second, third, and fourth pairs are distinct from each other. The integrated circuit package includes a ball grid array electrically coupled to the first pair, the second pair, the third pair, and the fourth pair.

EXAMPLE EMBODIMENTS

An integrated circuit (e.g., a serializer-deserializer circuit) may be electrically connected to a substrate (e.g., a printed circuit board) through solder balls arranged in a grid. Several signal integrity issues (e.g., insertion loss, reflection loss, and crosstalk) may become bottlenecks as data rates increase (e.g., beyond 112G). For example, crosstalk can become inevitable through the connection of solder balls, plating through-hole vias, and other forms of electrical coupling as the wavelength of the signal becomes far smaller than the pitch of the solder balls. One way to address these issues is to increase the distance between the signal solder balls (e.g., the solder balls that carry the signals), which may undesirably increase the size of the integrated circuit package (which may result in warpage). Another way to address these issues is to reduce the size of the solder balls, which also increases the distance between the solder balls. Reducing the size of the solder balls, however, may make it more difficult to solder the solder balls, resulting in reliability issues.

The present disclosure describes a pad grid pattern for a substrate and a ball grid pattern for an integrated circuit that may address these issues. Generally, the pad grid pattern includes ground pads that connect to ground and signal pads that connect to tracks that carry signals to and from the signal pads. The signal pads (e.g., high speed differential signal pads) are arranged in L-shaped patterns, which may be arranged symmetrically in the pad grid. Additionally, the pad grid may include stitching vias that provide additional electrical isolation. These stitching vias may also be arranged symmetrically in the pad grid. The ball grid pattern may include ground solder balls that couple to the ground pads and signal solder balls that couple to the signal pads. The signal solder balls (e.g., high speed differential solder balls) may also be arranged in L-shaped patterns, which may be arranged symmetrically in the ball grid.

In certain embodiments, the pad grid pattern and the ball grid pattern provide certain technical advantages. For example, the L-shaped patterns for the signal pads and signal solder balls reduce crosstalk relative to other pad grid patterns and ball grid patterns. Additionally, the stitching vias may provide additional electrical isolation, which further reduces crosstalk. As a result, systems that use the pad grid pattern and ball grid pattern may achieve higher data rates and signal integrity.

FIG. 1 illustrates an example system 100. As see in FIG. 1, the system 100 includes an integrated circuit 102 and a substrate 104. The integrated circuit 102 may be mounted on and electrically connected to the substrate 104. The substrate 104 may then carry electric signals to and from the integrated circuit 102.

The integrated circuit 102 may include a chip or circuit contained within a package 106. For example, the integrated circuit 102 may include a serializer-deserializer circuit. The package 106 may house the chip or circuit and provide electrical connections to and from the chip or circuit. The package 106 may include solder balls 108. The solder balls 108 may be positioned on a bottom surface of the integrated circuit 102. The solder balls 108 may be made of an electrically conductive material (e.g., tin, silver, copper or another metallic alloy). When heat is applied to the solder balls 108, the solder balls 108 may melt and attach to another surface, such as the substrate 104. In this manner, electrical connections are formed between the integrated circuit 102 and the substrate 104.

The solder balls 108 may be arranged as a ball grid array across the bottom surface of the integrated circuit 102. Some of the solder balls 108 may be considered ground solder balls, because the solder balls 108 connect to electrical ground. For example the ground solder balls may electrically connect to a ground pad, ground via, or ground plane of the substrate 104. The ground solder balls may also connect to a ground plane or ground layer in the integrated circuit 102. Some of the solder balls 108 may be considered signal solder balls. The signal solder balls may electrically connect to signal pads or signal vias of the substrate 104. The signal solder balls may carry electrical signals to and from the substrate 104 and the chip or circuit in the integrated circuit 102. The ground solder balls and the signal solder balls may be arranged in a grid on a bottom surface of the integrated circuit 102. In certain embodiments, the signal solder balls are arranged in an L-shaped pattern across the bottom surface of the integrated circuit 102. This arrangement of the signal solder balls reduces crosstalk and improves data rates in the system 100.

The substrate 104 provides a foundation for the integrated circuit 102. For example, the substrate 104 may provide mechanical support for the integrated circuit 102. The substrate 104 may be formed using any suitable materials. For example, the substrate 104 may be a printed circuit board with one or more layers. The top layer of the printed circuit board may include a grid of pads. Additional layers of the printed circuit board may include vias and a ground plane.

Additionally, the substrate 104 may provide electrical connections to and from the integrated circuit 102. For example, the substrate 104 may include the grid of pads to which the solder balls 108 of the integrated circuit 102 may electrically connect. The pads may be arranged as a grid across a top surface of the substrate 104. The pads in the grid may include ground pads that connect to ground vias or a ground plane of the substrate 104. The ground pads may be electrically connected to ground solder balls of the integrated circuit 102 to connect the ground solder balls to electrical ground. The pads in the grid may also include signal pads that carry signals to and from the integrated circuit 102. The signal pads may connect to signal solder balls of the integrated circuit 102. Additionally, the substrate 104 may include electrical tracks that connect to the signal pads. The tracks may run across the surface of the substrate 104 or another layer in the substrate 104 to carry electrical signals to and from the signal pads.

In particular embodiments, the signal pads may be arranged in an L-shaped pattern in the grid of the substrate 104. The L-shaped pattern may reduce crosstalk in the system 100, which improves data rates in the system 100. Additionally, the substrate 104 may define stitching vias that are electrically connected to ground. The stitching vias may provide additional electrical isolation between the pads of the substrate 104, which further reduces crosstalk.

Figure 2:
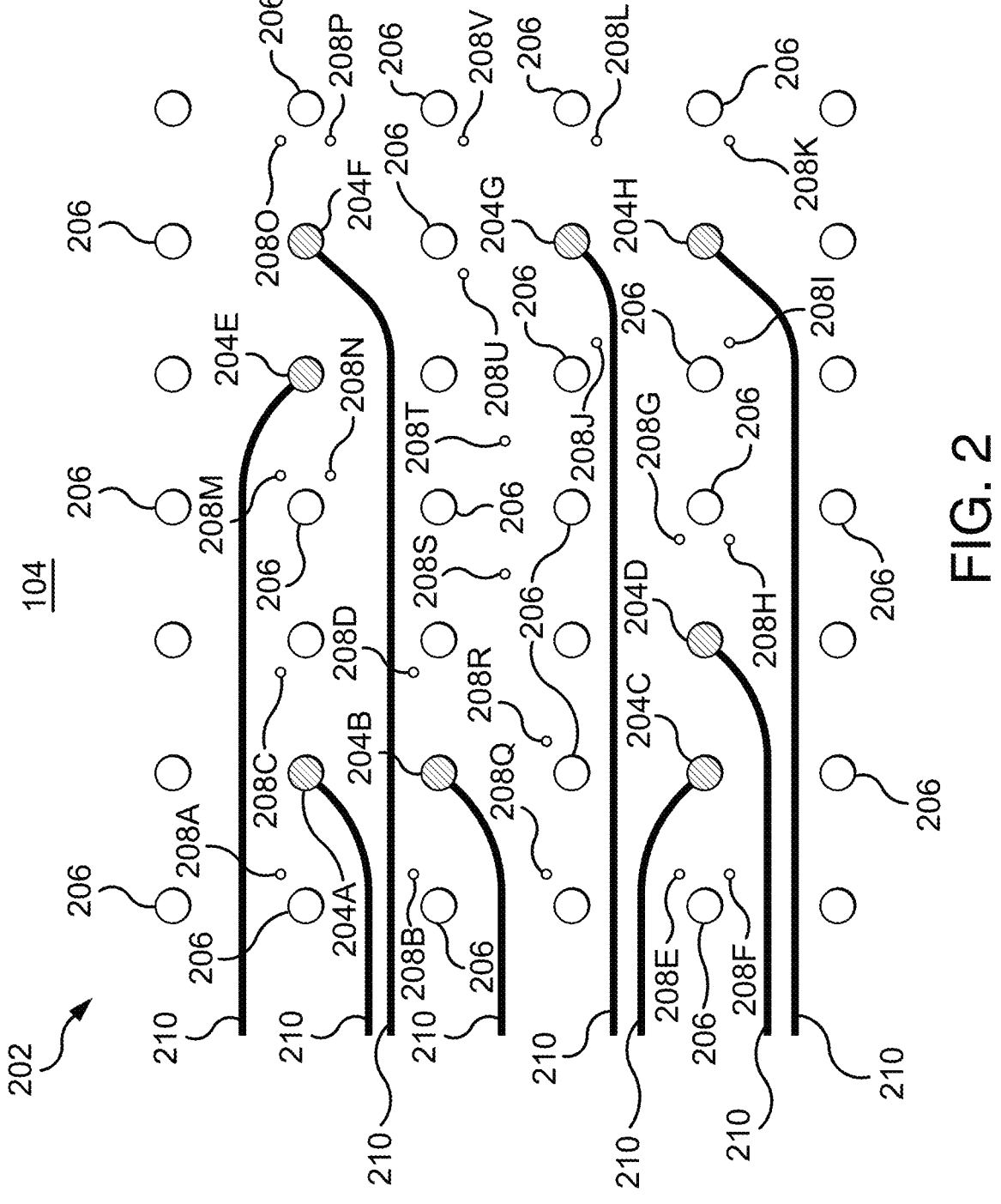
FIG. 2 illustrates an example grid of pads for the substrate in the system of FIG. 1.

FIG. 2 illustrates an example grid 202 of pads for the substrate 104 in the system 100 of FIG. 1. As discussed above, the grid 202 of pads may be arranged on a top surface of the substrate 104. The grid 202 of pads may electrically connect to the solder balls 108 on the bottom of the integrated circuit 102 to form electrical connections with the integrated circuit 102. In particular embodiments, the signal pads in the grid 202 are arranged in an L-shaped pattern that reduces crosstalk in the system 100.

As seen in FIG. 2, the grid 202 includes an arrangement of signal pads 204. Specifically, the grid 202 includes the signal pads 204A, 204B, 204C, 204D, 204E, 204F, 204G, and 204H. The signal pads 204A, 204B, 204C, and 204D are arranged in an L-shaped pattern. The signal pads 204E, 204F, 204G, and 204H are also arranged in an L-shaped pattern. However, the L-shaped pattern formed by the signal pads 204E, 204F, 204G, and 204H may be upside down relative to the L-shaped pattern formed by the signal pads 204A, 204B, 204C, and 204D.

The signal pads 204A and 204B may be positioned adjacent to each other in a column of the grid 202. Additionally, the signal pads 204C and 204D may be positioned adjacent to each other in a row of the grid 202. The signal pad 204C may be positioned in the same column of the grid 202 as the signal pads 204A and 204B. As a result, the signal pads 204A, 204B, 204C, and 204D form an L-shaped pattern. Likewise, the signal pads 204E and 204F are positioned adjacent to each other in a row of the grid 202. The signal pad 204A is positioned in the same row as the signal pads 204E and 204F. Additionally, the signal pads 204G and 204H are positioned adjacent to each other in a column of the grid 202. The signal pad 204F is positioned in the same column as the signal pads 204G and 204H. Moreover, the signal pad 204H is positioned in the same row as the signal pads 204C and 204D. In this manner, the signal pads 204E, 204F, 204G, and 204H form an L-shaped pattern that is upside down relative to the L-shaped pattern formed by the signal pads 204A, 204B, 204C, and 204D.

The pairs of adjacent signal pads 204A and 204B, 204C and 204D, 204E and 204F, and 204G and 204H may be differential pairs. For example, the signal pads 204A and 204B may carry signals that have the same magnitude but opposite polarity. The signal pads 204C and 204D may carry signals that have the same magnitude but opposite polarity. The signal pads 204E and 204F may carry signals that have the same magnitude but opposite polarity. The signal pads 204G and 204H may carry signals that have the same magnitude but opposite polarity. Additionally, the signal at the receiving end of a differential pair may be interpreted as the difference between the signals carried by the differential pair.

The grid 202 also includes multiple ground pads 206. For clarity, not all of the ground pads 206 in FIG. 2 are labeled. The ground pads 206 are represented in FIG. 2 by white circles that are approximately the same size as the signal pads 204. The ground pads 206 may electrically connect to ground vias or a ground plane of the substrate 104. Thus, the ground pads 206 provide an electrical connection to ground. The ground pads 206 may electrically connect to ground solder balls of the integrated circuit 102 to connect the ground solder balls to ground.

As see in FIG. 2, the ground pads 206 fill in the spaces in the grid 202 that are not occupied by the signal pads 204. The ground pads 206 provide some electrical isolation between the signal pads 204. Thus, the ground pads 206 may reduce crosstalk in the system 100. A ground pad 206 separates the signal pads 204B and 204C. Additionally, a ground pad 206 separates the signal pads 204F and 204G. Moreover, a column of ground pads 206 separate the L-shaped pattern formed by the signal pads 204A, 204B, 204C, and 204D from the L-shaped pattern formed by the signal pads 204E, 204F, 204G, and 204H. Ground pads 206 provide some electrical isolation between the signal pads 204 and between the L-shaped patterns, which reduces crosstalk in the system 100.

The substrate 104 further defines stitching vias 208 in the grid 202. The stitching vias 208 may be smaller than the signal pads 204 and the ground pads 206. The stitching vias 208 may electrically connect to the ground pads 206, ground vias, or a ground plane of the substrate 104. Thus, the stitching vias 208 may provide additional electrical isolation between the signal pads 204, which may reduce crosstalk in the system 100.

As seen in FIG. 2, the grid 202 defines the stitching vias 208A, 208B, 208C, 208D, 208E, 208F, 208G, 208H, 2081, 208J, 208K, 208L, 208M, 208N, 208O, 208P, 208Q, 208R, 208S, 208T, 208U, and 208V. Each of the stitching vias 208 is positioned near a ground pad 206 to provide additional electrical isolation between the signal pads 204. For example, the stitching vias 208A and 208C are positioned between ground pads 206 and the signal pad 204A. The stitching vias 208B and 208D are positioned between ground pads 206 and the signal pad 204B. The stitching vias 208E and 208F are positioned between a ground pad 206 and the signal pad 204C. The stitching vias 208G and 208H are positioned between a ground pad 206 and the signal pad 204D. The stitching vias 208M and 208N are positioned between a ground pad 206 and the signal pad 204E. The stitching vias 208O and 208P are positioned between a ground pad 206 and the signal pad 204F. The stitching vias 208J and 208L are positioned between ground pads 206 and the signal pad 204G. The stitching vias 2081 and 208K are positioned between ground pads 206 and the signal pad 204H.

Each of the stitching vias 208A, 208B, 208C, 208D, 208E, 208F, 208G, 208H, 2081, 208J, 208K, 208L, 208M, 208N, 208O, 208P, 208Q, 208R, 208S, 208T, 208U, and 208V are also positioned closer to a ground pad 206 than to a signal pad 204. For example, the stitching vias 208A and 208C are each positioned closer to a ground pad 206 than the signal pad 204A. The stitching vias 208B and 208D are each positioned closer to a ground pad 206 than the signal pad

204B. The stitching vias 208E and 208F are each positioned closer to a ground pad 206 than to the signal pad 204C. The stitching vias 208G and 208H are each positioned closer to a ground pad 206 than to the signal pad 204D. The stitching vias 208M and 208N are each positioned closer to a ground pad 206 than to the signal pad 204E. The stitching vias 208O and 208P are each positioned closer to a ground pad 206 than to the signal pad 204F. The stitching vias 208J and 208L are each positioned closer to a ground pad 206 than to the signal pad 204G. The stitching vias 2081 and 208K are each positioned closer to a ground pad 206 than to the signal pad 204H.

Additionally, the stitching vias 208 may be arranged symmetrically within the grid 202. For example, the stitching vias 208A, 208B, 208C, and 208D are positioned symmetrically about the signal pads 204A and 204B. Additionally, the stitching vias 208E, 208F, 208G, and 208H are positioned symmetrically about the signal pads 204C and 204D. The stitching vias 2081, 208J, 208K, and 208L may be positioned symmetrically about the signal pads 204G and 204H. The stitching vias 208M, 208N, 208O, and 208P may be positioned symmetrically about the signal pads 204E and 204F. Moreover, the stitching vias 208E and 208F may be positioned symmetrically about their respective ground pad 206. The stitching vias 208G and 208H may be positioned symmetrically about their respective ground pad 206. The stitching vias 208M and 208N may be positioned symmetrically about their respective ground pad 206. The stitching vias 208O and 208P may be positioned symmetrically about their respective ground pad 206. Furthermore, the stitching vias 208A, 208B, 208C, 208D, 208E, 208F, 208G, and 208H may be positioned about the L-shaped pattern formed by the signal pads 204A, 204B, 204C and 204D in a symmetric manner relative to how the stitching vias 2081, 208J, 208K, 208L, 208M, 208N, 208O, and 208P are positioned about the L-shaped pattern formed by the signal pads 204E, 204F, 204G, and 204H. In certain embodiments, the symmetric positioning of the stitching vias 208 further reduces crosstalk in the system 100, which improves data rates and performance of the system 100.

The stitching vias 208Q, 208R, 208S, 208T, 208U, and 208V are positioned laterally across the grid 202. The arrangement of the stitching vias 208Q, 208R, 208S, 208T, 208U, and 208V may form an isolation barrier across the grid 202. The isolation barrier may extend between the signal pads 204B and 204C and between the signal pads 204F and 204G. The isolation barrier may further reduce crosstalk between the signal pads 204, which further improves data rates and performance of the system 100.

The signal pads 204 may carry electric signals to and from the integrated circuit 102 connected to the substrate 104. As see in FIG. 2, electric tracks 210 may be routed through the grid 202 to connect to the signal pads 204. Each track 210 may connect to a signal pad 204, and each track 210 may route from the signal pad 204 to a boundary of the substrate 104. These tracks 210 may connect to signal sources or signal receivers connected to the substrate 104 or outside the substrate 104. The tracks 210 may carry signals to and from the connected signal pads 204. By contrast, the ground pads 206 may not connect to the tracks 210. Rather, the ground pads 206 may connect to a ground via or ground plane of the substrate 104. In some embodiments, the ground pads 206 may connect to tracks 210 that connect to ground.

Figure 3:
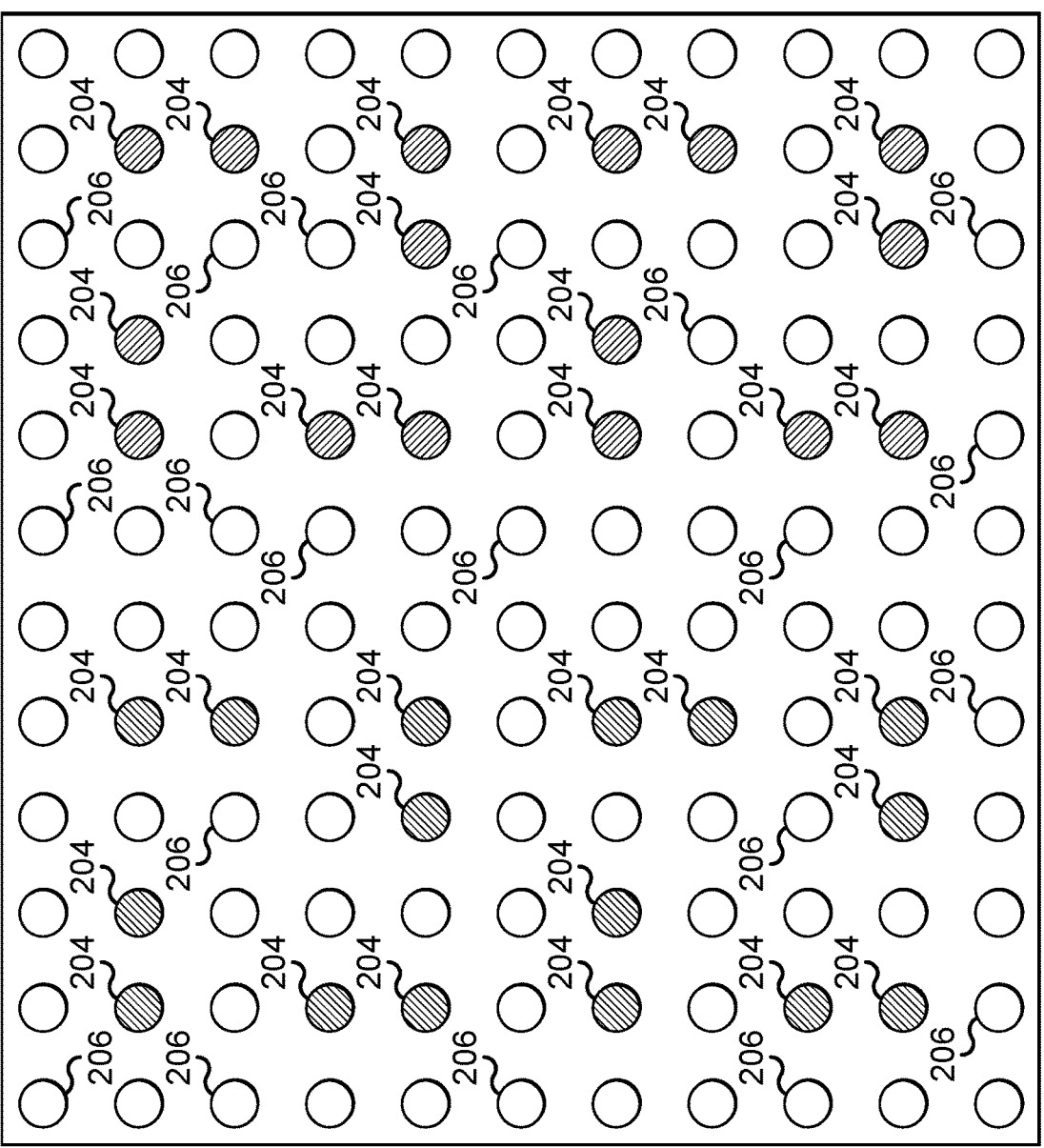
FIG. 3 illustrates an example grid of pads for the substrate in the system of FIG. 1.

The L-shaped patterns formed by the signal pads 204 in the grid 202 may be repeated across the surface of the substrate 104. FIG. 3 illustrates the example grid 202 of pads for the substrate 104 in the system 100 of FIG. 1. Specifically, FIG. 3 shows the L-shaped patterns formed by the signal pads 204 repeating multiple times in the grid 202. As seen in FIG. 3, the arrangement of the L-shaped patterns (e.g., with a first L-shaped pattern and a second L-shaped pattern that is upside down relative to the first L-shaped pattern) may be repeated multiple times in the grid 202. By repeating the L-shaped pattern multiple times across the grid 202 with ground pads 206 separating the L-shaped patterns, the grid 202 may further reduce crosstalk in the system 100.

Figure 4:
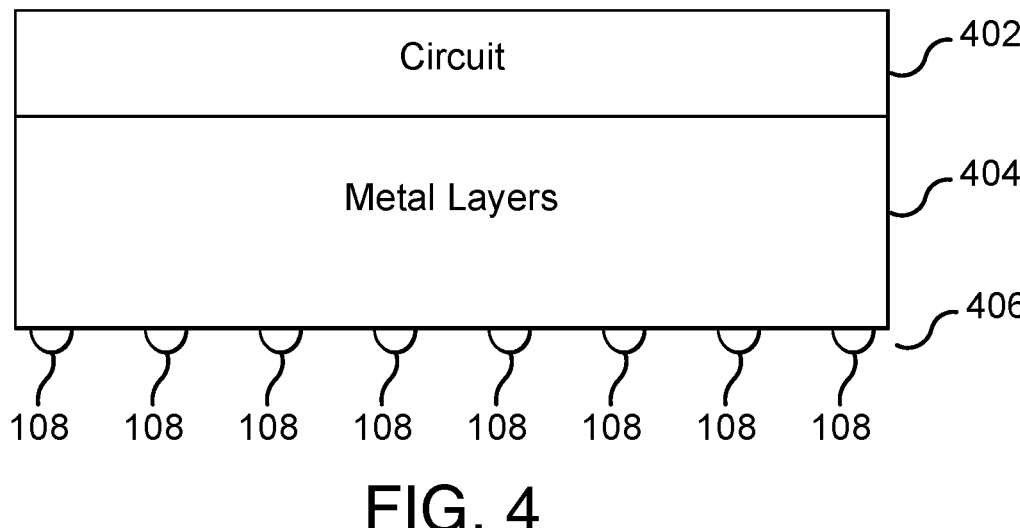
FIG. 4 illustrates an example integrated circuit in the system of FIG. 1.

FIG. 4 illustrates an example integrated circuit 102 in the system 100 of FIG. 1. As seen in FIG. 4, the integrated circuit 102 includes a circuit 402, one or more metal layers 404, and a ball grid array 406. The circuit 402 may be housed within the integrated circuit 102. The circuit 402 may transmit and/or receive electric signals to perform any suitable function. For example, the circuit 402 may be a serializer-deserializer circuit.

The metal layers 404 connect the circuit 402 to the ball grid array 406. The integrated circuit 102 may include any suitable number of metal layers 404. For example, one of the metal layers 404 may serve as a ground layer, while another metal layer 404 may serve as a signal layer. The signal layer may connect to signal solder balls in the ball grid array 406, while the ground layer may connect to ground solder balls in the ball grid array 406. Vias formed between the metal layers 404 may connect the circuit 402 to the metal layers 404 and to the ball grid array 406.

The ball grid array 406 is formed using the solder balls 108. The solder balls 108 may be arranged across a bottom surface of the integrated circuit 102 in a grid to form the ball grid array 406. As discussed above, the ball grid array 406 may include signal solder balls and ground solder balls. The signal solder balls may be arranged in an L-shaped pattern, which reduces crosstalk in the integrated circuit 102, in certain embodiments.

Figure 5:
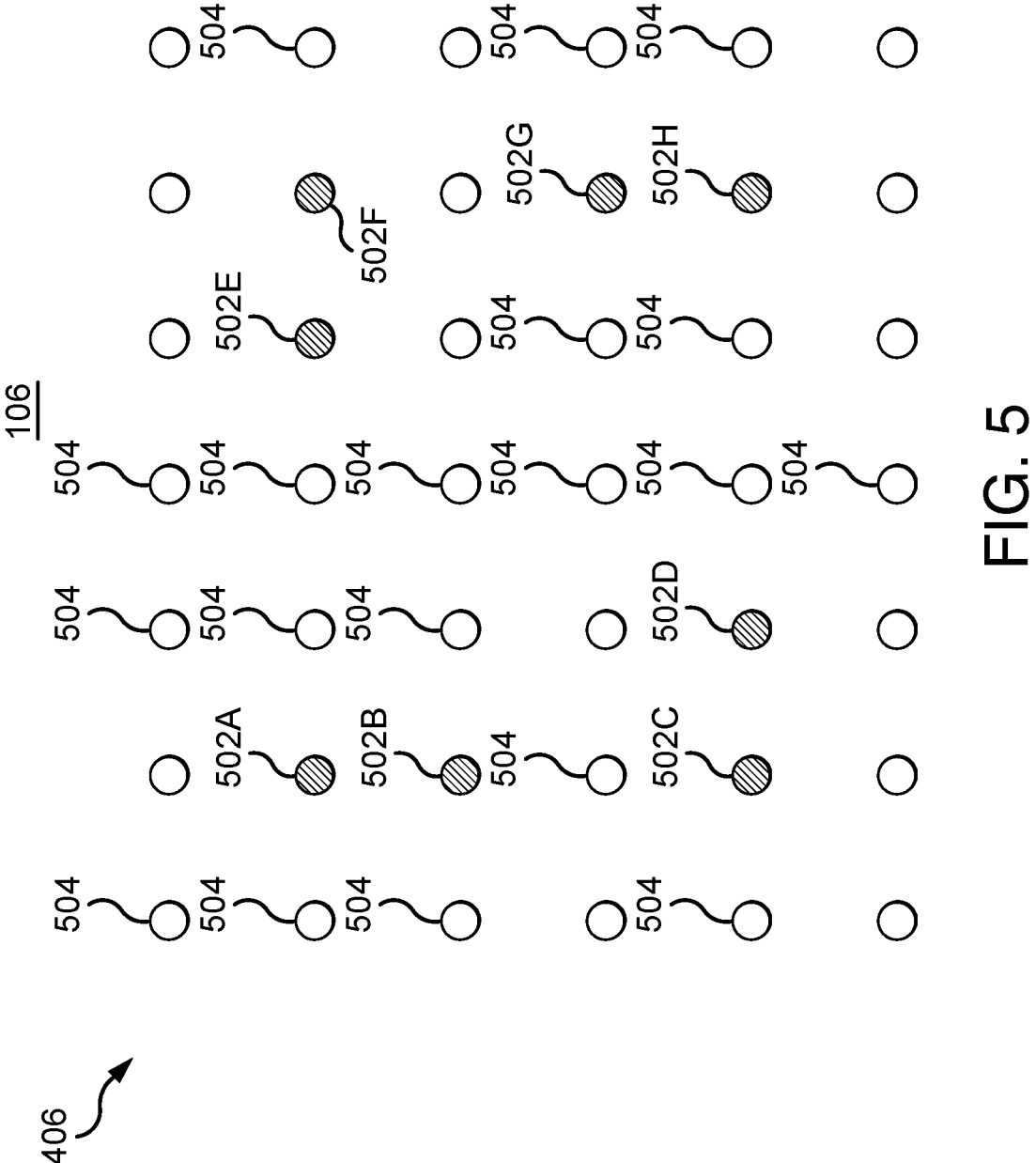
FIG. 5 illustrates an example ball grid array for the packaging of the integrated circuit of FIG. 4.

FIG. 5 illustrates an example ball grid array 406 for the packaging 106 of the integrated circuit 102 of FIG. 4. As seen in FIG. 5, the ball grid array 406 includes signal solder balls 502 and ground solder balls 504. Generally, the signal solder balls 502 are arranged in an L-shaped pattern such that the signal solder balls 502 may electrically connect to the signal pads 204 in the grid 202 of pads on the substrate 104.

The ball grid array 406 includes the signal solder balls 502A, 502B, 502C, 502D, 502E, 502F, 502G, and 502H. Each of the signal solder balls 502 may carry electric signals to and from the circuit 402 in the integrated circuit 102 (e.g., through the connections provided by the metal layers 404). As see in FIG. 5, the signal solder balls 502A, 502B, 502C, and 502D are arranged in an L-shaped pattern. The signal solder balls 502A and 502B are positioned adjacent to each other in a column of the ball grid array 406. The signal solder balls 502C and 502D are positioned adjacent to each other in a row of the ball grid array 406. The signal solder ball 502C is positioned in the same column as the signal solder balls 502A and 502B. The signal solder balls 502E, 502F, 502G, and 502H are also arranged in an L-shaped pattern. The signal solder balls 502E and 502F are positioned adjacent to each other in a row of the ball grid array 406. The signal solder ball 502A is positioned in the same row as the signal solder balls 502E and 502H. The signal solder balls 502G and 502H are positioned adjacent to each other in a column of the ball grid array 406. The signal solder ball 502F is positioned in the same column as the signal solder balls 502G and 502H. The signal solder ball 502H is positioned in the same row as the signal solder balls 502C and 502D. Thus, the signal solder balls 502E, 502F,

502G, and 502H form an L-shaped pattern that is upside down relative to the L-shaped pattern formed by the signal solder balls 502A, 502B, 502C, and 502D. Due to the L-shaped pattern of the signal solder balls 502, crosstalk between the signal solder balls 502 is reduced. As with the L-shaped patterns in the grid 202, the L-shaped patterns in the ball grid array 406 may repeat across the bottom surface of the integrated circuit 102.

The pairs of adjacent signal solder balls 502A and 502B, 502C and 502D, 502E and 502F, and 502G and 502H may be differential pairs. For example, the signal solder balls 502A and 502B may carry signals that have the same magnitude but opposite polarity. The signal solder balls 502C and 502D may carry signals that have the same magnitude but opposite polarity. The signal solder balls 502E and 502F may carry signals that have the same magnitude but opposite polarity. The signal solder balls 502G and 502H may carry signals that have the same magnitude but opposite polarity. Additionally, the signal at the receiving end of a differential pair may be interpreted as the difference between the signals carried by the differential pair.

The ball grid array 406 also includes ground solder balls 504 that electrically connect to ground. For clarity, not all of the ground solder balls 504 are labeled in FIG. 5. The ground solder balls 504 are represented in FIG. 5 by the white circles that are approximately the same size as the signal solder balls 502. The ground solder balls 504 may electrically connect to a ground layer in the integrated circuit 102 or to ground pads 206 on the substrate 104. As see in FIG. 5, the ground solder balls 504 may be positioned between some of the signal solder balls 502 in the ball grid array 406 to provide some electric isolation between the signal solder balls 502. For example, a ground solder ball 504 is positioned between the signal solder ball 502B and the signal solder ball 502C. A ground solder ball 504 is positioned between the signal solder ball 502F and the signal solder ball 502G. Additionally, a column of ground solder balls 504 is positioned between the L-shaped pattern formed by the signal solder balls 502A, 502B, 502C, and 502D and the L-shaped pattern formed by the signal solder balls 502E, 502F, 502G, and 502H. In this manner, the ground solder balls 504 may reduce crosstalk between some of the signal solder balls 502, which improves data rates and signal integrity for the integrated circuit 102.

Heat may be applied to the signal solder balls 502 and the ground solder balls 504 in the ball grid array 406 to melt the signal solder balls 502 and the ground solder balls 504. The melted solder may then be attached to the signal pads 204 and ground pads 206 of the grid 202 on the substrate 104 to form electrical connections between the substrate 104 and the integrated circuit 102. After the integrated circuit 102 is attached to the substrate 104, electrical signals may be communicated between the substrate 104 and the integrated circuit 102. For example, electric signals may be communicated from the substrate 104 to the integrated circuit 102 through the signal solder balls 502. Additionally, the ground solder balls 504 may be electrically connected to ground.

Due to the arrangement of the signal pads 204, the ground pads 206, the stitching vias 208, the signal solder balls 502, and the ground solder balls 504, crosstalk may be reduced in the system 100. For example, the L-shaped arrangement of the signal pads 204 and the signal solder balls 502 may reduce crosstalk between the signal pads 204 and between the signal solder balls 502. Separating the signal pads 204 using ground pads 206 and separating the signal solder balls 502 using ground solder balls 504 may increase electrical isolation and further reduce crosstalk between signal pads 204 and between signal solder balls 502. Forming stitching vias 208 between ground pads 206 and signal pads 204 may further increase electrical isolation and reduce crosstalk between signal pads 204. Furthermore, the symmetric arrangement of the signal pads 204, the ground pads 206, the stitching vias 208, the signal solder balls 502, and the ground solder balls 504 may further reduce crosstalk between the signal pads 204 and between the signal solder balls 502.

In summary, the grid 202 includes ground pads 206 that connect to ground and signal pads 204 that connect to tracks 210 that carry signals to and from the signal pads 204. The signal pads 204 are arranged in L-shaped patterns, which may be arranged symmetrically in the grid 202. Additionally, the grid 202 may include stitching vias 208 that provide additional electrical isolation. These stitching vias 208 may also be arranged symmetrically in the grid 202. The ball grid array 406 may include ground solder balls 504 that couple to the ground pads 206 and signal solder balls 502 that couple to the signal pads 204. The signal solder balls 502 may also be arranged in L-shaped patterns, which may be arranged symmetrically in the ball grid array 406.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A substrate comprising:
a grid of pads comprising:
a first pair of adjacent signal pads arranged in a first column of the grid;
a second pair of adjacent signal pads arranged in a first row of the grid, wherein a first signal pad of the second pair is arranged in the first column, and wherein a second signal pad of the second pair is arranged in a second column;
a third pair of adjacent signal pads arranged in a second row of the grid, wherein a first signal pad of the first pair is arranged in the second row, and wherein a second signal pad of the third pair is arranged in a third row;
a fourth pair of adjacent signal pads arranged in a third column of the grid, wherein a first signal pad of the third pair is arranged in the third column, wherein a second signal pad of the third pair is arranged in a fourth column, wherein a first signal pad of the fourth pair is arranged in the first row, wherein a second signal pad of the fourth pair is arranged in a fourth row, and wherein the first, second, third, and fourth pairs are distinct from each other;
a first ground pad arranged adjacent to the second signal pad of the first pair in the third row and the second column;
a second ground pad arranged adjacent to the second signal pad of the second pair in the fourth row and the second column;
a third ground pad arranged adjacent to the second signal pad of the third pair in the third row and the fourth column; and
a fourth ground pad arranged adjacent to the second signal pad of the fourth pair in the fourth row and the fourth column; and
a plurality of tracks, wherein each signal pad of the first pair, the second pair, the third pair, and the fourth pair is electrically coupled to a track of the plurality of tracks.

2. The substrate of claim 1, wherein:
the grid of pads further comprises a fifth ground pad arranged adjacent to the first signal pad of the first pair in the second row and the second column; and
the substrate defines a first stitching via arranged between the first signal pad of the first pair and the fifth ground pad.

3. The substrate of claim 2, wherein the first stitching via is positioned closer to the fifth ground pad than the first signal pad of the first pair.

4. The substrate of claim 2, wherein the first stitching via is smaller than the fifth ground pad.

5. The substrate of claim 2, wherein the first stitching via and the fifth ground pad are electrically coupled to ground.

6. The substrate of claim 2, wherein a second fifth signal pad of the second pair is arranged in the second column.

7. The substrate of claim 2, wherein:
the substrate further defines a second stitching via arranged between the second signal pad of the first pair and the first ground pad.

8. The substrate of claim 2, wherein the first stitching via is smaller than the first signal pad of the first pair.

9. The substrate of claim 1, wherein the substrate further defines a plurality of stitching vias forming an isolation barrier between the first pair and the second pair and between the third pair and the fourth pair.

10. The substrate of claim 1, wherein the first pair of adjacent signal pads and the second pair of adjacent signal pads form an L-shape.

11. An integrated circuit package comprising:
a ball grid array comprising:
a first pair of adjacent signal solder balls arranged in a first column;
a second pair of adjacent signal solder balls arranged in a first row, wherein a first signal solder ball of the second pair is arranged in the first column, and wherein a second signal solder ball of the second pair is arranged in a second column;
a third pair of adjacent signal solder balls arranged in a second row, wherein a first signal solder ball of the first pair is arranged in the second row, and wherein a second signal solder ball of the third pair is arranged in a third row;
a fourth pair of adjacent signal solder balls arranged in a third column, wherein a first signal solder ball of the third pair is arranged in the third column, wherein a second signal solder ball of the third pair is arranged in a fourth column, wherein a first signal solder ball of the fourth pair is arranged in the first row, wherein a second signal solder ball of the fourth pair is arranged in a fourth row, and wherein the first pair of adjacent signal solder balls, the second pair of adjacent signal solder balls, the third pair of adjacent signal solder balls, and the fourth pair of adjacent signal solder balls are distinct from each other;

a first ground solder ball arranged adjacent to the second signal solder ball of the first pair in the third row and the second column;

a second ground solder ball arranged adjacent to the second signal solder ball of the second pair in the fourth row and the second column;

a third ground solder ball arranged adjacent to the second signal solder ball of the third pair in the third row and the fourth column; and a fourth ground solder ball arranged adjacent to the second signal solder ball of the fourth pair in the fourth row and the fourth column; and a metal layer electrically coupled to the first pair of adjacent signal solder balls, the second pair of adjacent signal solder balls, the third pair of adjacent signal solder balls, and the fourth pair of adjacent signal solder balls.

12. The integrated circuit package of claim 11, wherein the first pair of adjacent signal solder balls and the second pair of adjacent signal solder balls form an L-shape.

13. A system comprising:

a printed circuit board comprising:

a first pair of signal pads arranged in a first column of a grid of pads;

a second pair of signal pads arranged in a first row of the grid of pads, wherein a first signal pad of the second pair is arranged in the first column, and wherein a second signal pad of the second pair is arranged in a second column of the grid of pads;

a third pair of signal pads arranged in a second row of the grid of pads, wherein a first signal pad of the first pair is arranged in the second row, and wherein a second signal pad of the third pair is arranged in a third row of the grid of pads;

a fourth pair of signal pads arranged in a third column of the grid of pads, wherein a first signal pad of the third pair is arranged in the third column, wherein a second signal pad of the third pair is arranged in a fourth column of the grid of pads, wherein a first signal pad of the fourth pair is arranged in the first row, wherein a second signal pad of the fourth pair is arranged in a fourth row of the grid of pads, and wherein the first, second, third, and fourth pairs are distinct from each other;

a first ground pad arranged adjacent to the second signal pad of the first pair in the third row and the second column;

a second ground pad arranged adjacent to the second signal pad of the second pair in the fourth row and the second column;

a third ground pad arranged adjacent to the second signal pad of the third pair in the third row and the fourth column; and a fourth ground pad arranged adjacent to the second signal pad of the fourth pair in the fourth row and the fourth column; and an integrated circuit package comprising a ball grid array electrically coupled to the first pair, the second pair, the third pair, and the fourth pair.

14. The system of claim 13, wherein:

the printed circuit board further comprises a fifth ground pad arranged adjacent to the first signal pad of the first pair in the second row and the second column; and the printed circuit board defines a first stitching via arranged between the first signal pad of the first pair and the fifth ground pad.

15. The system of claim 14, wherein the first stitching via is positioned closer to the fifth ground pad than the first signal pad of the first pair.

16. The system of claim 14, wherein the first stitching via is smaller than the fifth ground pad.

17. The system of claim 14, wherein the first stitching via and the fifth ground pad are electrically coupled to ground.

18. The system of claim 14, wherein a second fifth signal pad of the second pair is arranged in the second column.

* * * * *